(12) United States Patent
Lee et al.

(10) Patent No.: US 10,424,547 B2
(45) Date of Patent: Sep. 24, 2019

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Chih Cheng Lee, Kaohsiung (TW); Yuan-Chang Su, Kaohsiung (TW)

(73) Assignee: ADVANCED SEMICONDUCTOR ENGINEERING INC., Kaohsiung (TW)

( * ) Notice: Subject to any disclaimer, the term of this patent is extended or adjusted under 35 U.S.C. 154(b) by 7 days.

(21) Appl. No.: 15/691,053

(22) Filed: Aug. 30, 2017

(65) Prior Publication Data

US 2019/0067211 A1     Feb. 28, 2019

(51) Int. Cl.
| | |
|---|---|
| *H05K 1/03* | (2006.01) |
| *H05K 1/11* | (2006.01) |
| *H01L 23/00* | (2006.01) |
| *H01L 23/498* | (2006.01) |
| *H01L 21/683* | (2006.01) |

(Continued)

(52) U.S. Cl.
CPC .......... *H01L 23/562* (2013.01); *H01L 21/486* (2013.01); *H01L 21/4857* (2013.01); *H01L 21/6835* (2013.01); *H01L 23/49822* (2013.01); *H01L 23/49827* (2013.01); *H01L 23/49838* (2013.01); *H01L 23/49894* (2013.01); *H05K 1/0284* (2013.01); *H05K 1/0366* (2013.01); *H05K 1/113* (2013.01); *H01L 2221/68345* (2013.01); *H01L 2221/68359* (2013.01); *H05K 1/036* (2013.01); *H05K 1/0313* (2013.01); *H05K 1/111* (2013.01); *H05K 1/119* (2013.01)

(58) Field of Classification Search
CPC ............ H01L 23/562; H01L 23/49894; H01L 23/49838; H01L 21/486; H01L 23/49827; H01L 23/49822; H01L 21/4857; H01L 21/6835; H01L 2221/68359; H01L 2221/68345; H05K 1/024; H05K 1/0366; H05K 1/038; H05K 2201/0275; H05K 2201/0278; H05K 2201/0287; H05K 2201/029; H05K 2201/0293; H05K 2201/09136

See application file for complete search history.

(56) References Cited

U.S. PATENT DOCUMENTS 8,502,391 B2 *   8/2013   Park .................... H01L 21/4846
                                                                                                                                                             257/774
9,257,386 B2 *   2/2016   Arisaka ................ H05K 1/0366

(Continued)

*Primary Examiner* — Ishwarbhai B Patel
(74) *Attorney, Agent, or Firm* — Foley & Lardner LLP; Cliff Z. Liu

(57) ABSTRACT

A substrate for packaging a semiconductor device is disclosed. The substrate includes a first dielectric layer having a first surface and a second surface opposite to the first surface, a first patterned conductive layer adjacent to the first surface of the first dielectric layer, and a second patterned conductive layer adjacent to the second surface of the first dielectric layer. The first dielectric layer includes a first portion adjacent to the first surface, a second portion adjacent to the second surface, and a reinforcement structure between the first portion and the second portion. A thickness of the first portion of the first dielectric layer is different from a thickness of the second portion of the first dielectric layer.

14 Claims, 14 Drawing Sheets

(51) Int. Cl.
*H01L 21/48* (2006.01)
*H05K 1/02* (2006.01)

(56) References Cited

U.S. PATENT DOCUMENTS

| | | | |
|---|---|---|---|
| 9,307,636 B2* | 4/2016 | Kato | H05K 1/024 |
| 2011/0123808 A1 | 5/2011 | Lee et al. | |
| 2015/0104630 A1* | 4/2015 | Moon | H05K 1/0366 |
| | | | 428/220 |
| 2016/0064319 A1* | 3/2016 | Suzuki | H01L 23/49827 |
| | | | 174/251 |

* cited by examiner

SEMICONDUCTOR DEVICE PACKAGE AND A METHOD OF MANUFACTURING THE SAME

BACKGROUND

1. Technical Field

The present disclosure relates to a substrate for packaging a semiconductor device. More particularly, the present disclosure relates to a substrate including a dielectric layer with a reinforcement structure that is closer to a top surface or a bottom surface of the dielectric layer.

2. Description of the Related Art

In a semiconductor device package, a substrate is used to package a semiconductor device. The substrate may include a first conductive layer adjacent to one side of a dielectric layer, and a second conductive layer adjacent to another side of the dielectric layer. Each of the first conductive layer and the second conductive layer is covered or surrounded by a solder mask layer for protection. Warpage issue may occur in the substrate which may adversely affect a subsequent operation; for example, the bent substrate (caused by warpage) may result in reliability issue when or subsequent to attaching the semiconductor device to the substrate. Structural difference between the dielectric layer, the first conductive layer and the second conductive layer (e.g., asymmetric structure/arrangement, quantity, or dimension) may lead to warpage of the substrate.

SUMMARY

In some embodiments, according to one aspect, a substrate for packaging a semiconductor device includes a first dielectric layer having a first surface and a second surface opposite to the first surface, a first patterned conductive layer adjacent to the first surface of the first dielectric layer, and a second patterned conductive layer adjacent to the second surface of the first dielectric layer. The first dielectric layer includes a first portion adjacent to the first surface, a second portion adjacent to the second surface, and a reinforcement structure between the first portion and the second portion. A thickness of the first portion of the first dielectric layer is different from a thickness of the second portion of the first dielectric layer.

In some embodiments, according to another aspect, a substrate for packaging a semiconductor device includes a dielectric layer having a first surface and a second surface opposite to the first surface, a first patterned conductive layer adjacent to the first surface of the dielectric layer, and a second patterned conductive layer adjacent to the second surface of the dielectric layer. The dielectric layer includes a resin layer and a reinforcement structure. A central line of the reinforcement structure is offset from or misaligned with a central line of the dielectric layer.

In some embodiments, according to another aspect, a method is disclosed for manufacturing a substrate. The method includes providing a carrier, forming a first patterned conductive layer on the carrier, and laminating a first dielectric layer on the first patterned conductive layer. The first dielectric layer has a first surface adjacent to the first patterned conductive layer and a second surface opposite to the first surface. The first dielectric layer includes a reinforcement structure closer to one of the first surface or the second surface. The method also includes forming a second patterned conductive layer on the second surface of the first dielectric layer. The second patterned conductive layer is electrically connected to the first patterned conductive layer. The method also includes removing the carrier.

DETAILED DESCRIPTION

Figure 1A:
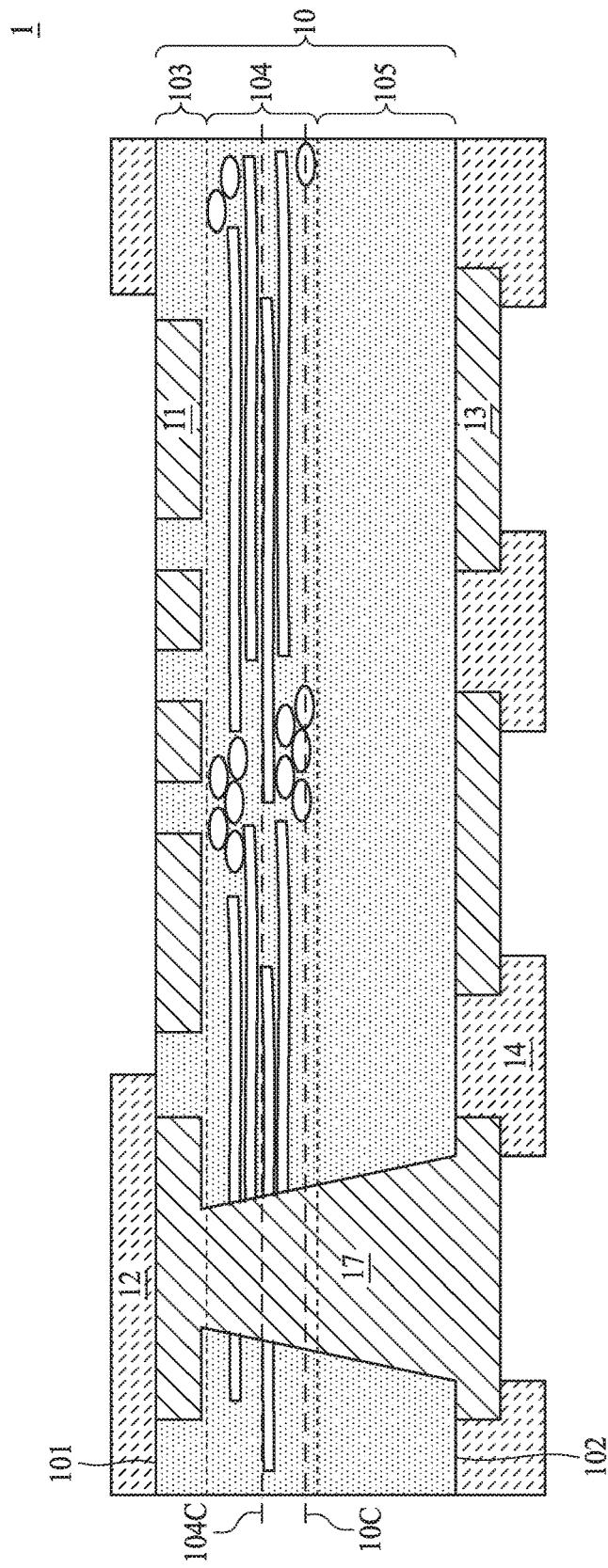
FIG. 1A illustrates a cross-sectional view of a substrate according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated drawing. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A is a cross-sectional view of a substrate 1 for packaging a semiconductor device in accordance with some embodiments of the present disclosure. The substrate 1 includes a dielectric layer 10, a patterned conductive layer 11, a protection layer 12, another patterned conductive layer 13, another protection layer 14, and an interconnection element 17.

The dielectric layer 10 includes a surface (e.g., a top surface) 101 and a surface (e.g., a bottom surface) 102 opposite to the surface 101. The dielectric layer 10 includes a resin structure/layer and a fiberglass. In some embodiments, the dielectric layer 10 includes a portion (e.g., a top portion) 103 and a portion (e.g., a bottom portion) 105 and a reinforcement structure 104. The portion 103 and the portion 105 are resin layers. In some embodiments, the portion 103 and the portion 105 are each substantially devoid of glass fibers or other reinforcement fibers, such as where any such fibers constitute less than about 5 percent by weight of each of the portion 103 and the portion 105. A thickness of the portion 105 is greater than a thickness of the portion 103, such as at least about 1.1 times greater, at least about 1.2 times greater, at least about 1.3 times greater, or at least about 1.5 times greater. The thickness of the portion 103 of the dielectric layer 10 is not less than about 3 μm. The reinforcement structure 104 includes a resin layer and a fiberglass. In some embodiments, the reinforcement structure 104 is a fiber-reinforced resin layer including glass fibers or other reinforcement fibers disposed within a resin layer. The reinforcement structure 104 is between the portion 103 and the portion 105. The reinforcement structure 104 is adjacent to the surface 101 of the dielectric layer 10. The reinforcement structure 104 is separated or spaced from the patterned conductive layer 11 by a distance. The distance between the reinforcement structure 104 and the patterned conductive layer 11 is a non-zero value. In some embodiments, a coefficient of thermal expansion (CTE) of the reinforcement structure 104 is less than a CTE of the portion 103, and is less than a CTE of the portion 105.

The dielectric layer 10 has a central line 10C, extending through middle points between the surface 101 and the surface 102 of the dielectric layer 10. The reinforcement structure 104 has a central line 104C, extending through middle points between an upper boundary of the reinforcement structure 104 and a lower boundary of the reinforcement structure 104. The central line 104C of the reinforcement structure 104 is misaligned with or offset from the central line 10C of the dielectric layer 10. In some embodiments, the central line 104C of the reinforcement structure 104 is disposed above the central line 10C of the dielectric layer 10.

The patterned conductive layer 11 is adjacent to and is exposed from the surface 101 of the dielectric layer 10. In some embodiments, the patterned conductive layer 11 is embedded in the surface 101 of the dielectric layer 10, and does not protrude from the surface 101. The patterned conductive layer 13 is adjacent to the surface 102 of the dielectric layer 10. In some embodiments, the patterned conductive layer 13 is on the surface 102 of the dielectric layer 10, and protrudes from the surface 102. The patterned conductive layer 11 is electrically connected to the patterned conductive layer 13 via the interconnection element 17. In some embodiments, the patterned conductive layers 11, 13, and the interconnection element 17 may include copper, another metal or metal alloy, or other suitable conductive materials.

In some embodiments, a density of the patterned conductive layer 11 (e.g. a percentage of an area of the surface 101 occupied by the patterned conductive layer 11 from a top view) is less than a density of the patterned conductive layer 13 (e.g. a percentage of an area of the surface 102 occupied by the patterned conductive layer 13 from a bottom view). For example, an amount or quantity of a conductive material of the patterned conductive layer 13 is relatively greater than an amount or quantity of a conductive material of the patterned conductive layer 11. In such embodiments, a thickness of the patterned conductive layer 11 may be substantially the same as a thickness of the patterned conductive layer 13.

In some embodiments, the thickness of the patterned conductive layer 11 is less than the thickness of the patterned conductive layer 13. In such embodiments, the density of the patterned conductive layer 11 may be substantially the same as the density of the patterned conductive layer 13.

That is, the amount of the conductive material disposed adjacent to the surface 102 of the dielectric layer 10 is greater than the amount of the conductive material disposed adjacent to the surface 101 of the dielectric layer 10, which may otherwise cause a left end and a right end of the dielectric layer 10 to upwardly bend. The positioning of the reinforcement structure 104 closer to the surface 101 of the dielectric layer 10 mitigates against the upward bending of the dielectric layer 10 so as to counterbalance against such warpage, without requiring adjusting a thickness of the protection layer 12 or 14.

The protection layer 12 is disposed on the surface 101 of the dielectric layer 10. The protection layer 12 partially covers the patterned conductive layer 11. In some embodiments, the protection layer 12 may include a solder mask layer or other suitable materials.

The protection layer 14 is disposed on the surface 102 of the dielectric layer 10. The protection layer 14 partially covers the patterned conductive layer 13. In some embodiments, the protection layer 14 may include a solder mask layer or other suitable materials.

Figure 1B:
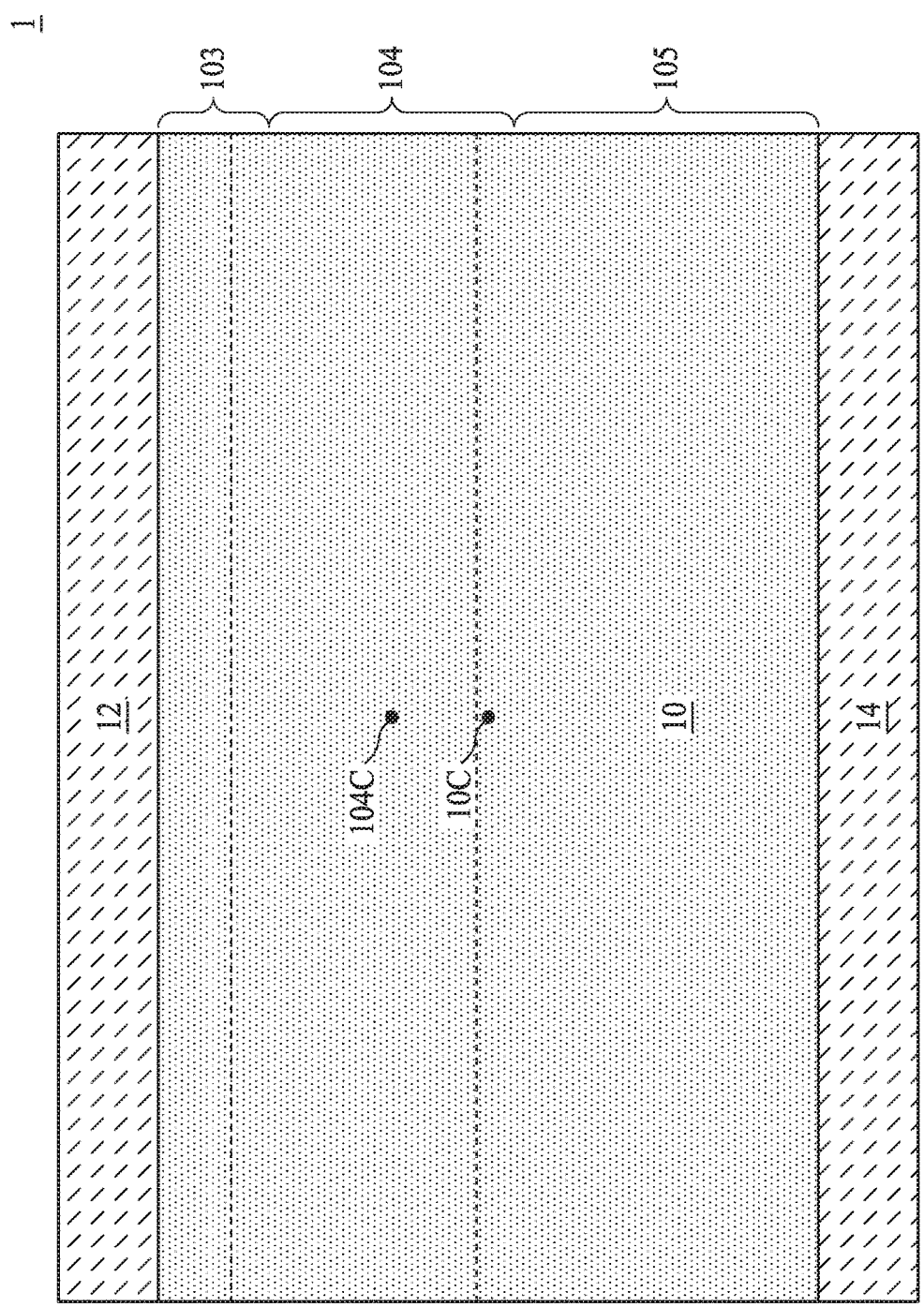
FIG. 1B illustrates a cross-sectional lateral view of a substrate according to some embodiments of the present disclosure.

FIG. 1B illustrates a cross-sectional lateral view of the substrate 1 according to some embodiments of the present disclosure.

On a lateral side of the dielectric layer 10, the central line 104C is located at a middle point of a lateral side of the reinforcement structure 104. The central line 10C is located at a middle point of the lateral side of the dielectric layer 10. The middle point of the central line 104C of the reinforcement structure 104 is separated from the middle point of the central line 10C of the dielectric layer 10 by a non-zero distance. For example, the non-zero distance is at least about 5%, at least about 10%, or at least about 15% of a thickness of the dielectric layer 10.

Figure 2A:
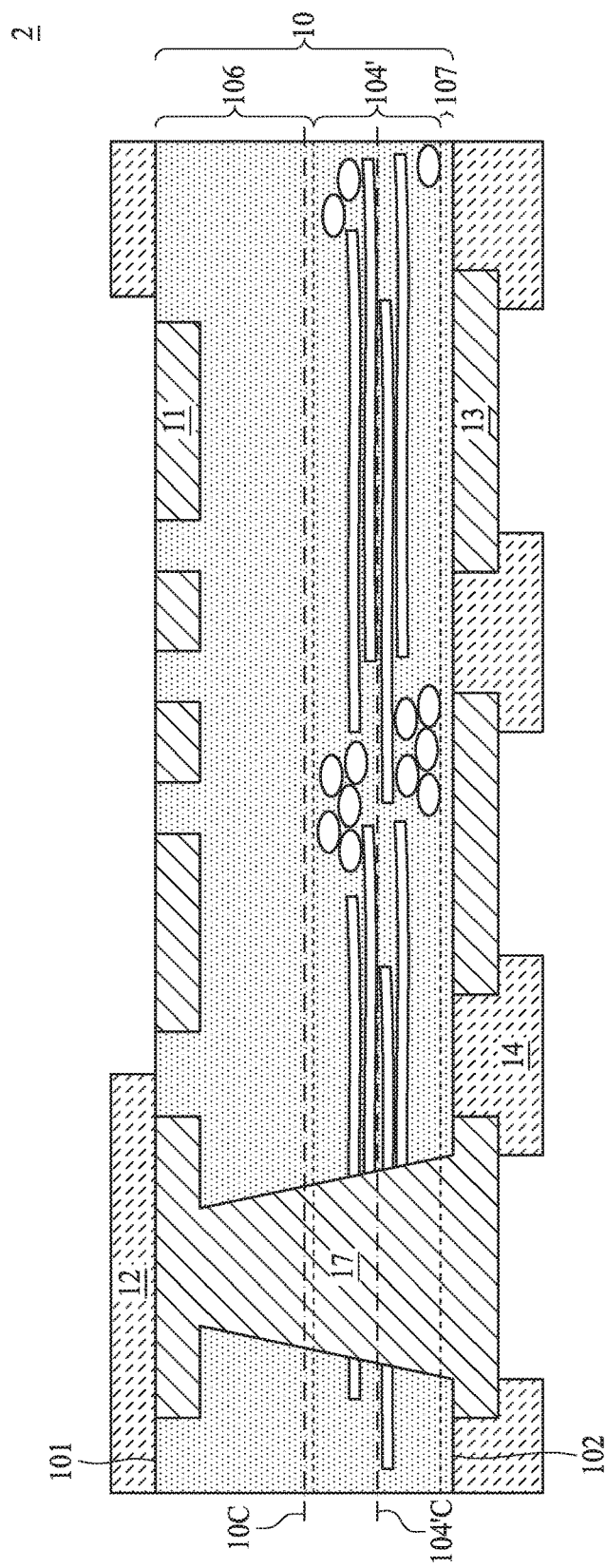
FIG. 2A illustrates a cross-sectional view of a substrate according to some embodiments of the present disclosure.

FIG. 2A is a cross-sectional view of a substrate 2 for packaging a semiconductor device in accordance with some embodiments of the present disclosure. The substrate 2 includes a dielectric layer 10, a patterned conductive layer 11, a protection layer 12, another patterned conductive layer 13, another protection layer 14, and an interconnection element 17. The structure depicted in FIG. 2A is similar to the structure depicted in FIG. 1A, except that a reinforcement structure 104' depicted in FIG. 2A is adjacent to a surface 102 of the dielectric layer 10.

The dielectric layer 10 includes a resin structure/layer and a fiberglass. In some embodiments, the dielectric layer 10 includes portions 106 and 107 and the reinforcement structure 104' between the portions 106 and 107. The portion 106 and the portion 107 are resin layers. A thickness of the portion 106 is greater than a thickness of the portion 107, such as at least about 1.1 times greater, at least about 1.2 times greater, at least about 1.3 times greater, or at least about 1.5 times greater. The thickness of the portion 107 of the dielectric layer 10 is not less than about 3 μm. The reinforcement structure 104' includes a resin layer and a fiberglass. The reinforcement structure 104' is separated or spaced from the patterned conductive layer 13 by a distance.

The distance between the reinforcement structure 104' and the patterned conductive layer 13 is a non-zero value.

The dielectric layer 10 has a central line 10C. The reinforcement structure 104' has a central line 104'C. The central line 104'C of the reinforcement structure 104' is misaligned with or offset from the central line 10C of the dielectric layer 10. In some embodiments, the central line 104'C of the reinforcement structure 104 is disposed below the central line 10C of the dielectric layer 10.

In some embodiments, a density of the patterned conductive layer 11 is greater than a density of the patterned conductive layer 13. In such embodiments, a thickness of the patterned conductive layer 11 may be substantially the same as a thickness of the patterned conductive layer 13.

In some embodiments, the thickness of the patterned conductive layer 11 is greater than the thickness of the patterned conductive layer 13. In such embodiments, the density of the patterned conductive layer 11 may be substantially the same as the density of the patterned conductive layer 13.

That is, an amount of a conductive material disposed adjacent to the surface 101 of the dielectric layer 10 is greater than an amount of the conductive material disposed adjacent to the surface 102 of the dielectric layer 10, which may otherwise cause a left end and a right end of the dielectric layer 10 to downwardly bend. The positioning of the reinforcement structure 104' closer to the surface 102 of the dielectric layer 10 mitigates against the downward bending of the dielectric layer 10 so as to counterbalance against such warpage, without requiring adjusting a thickness of the protection layer 12 or 14.

Figure 2B:
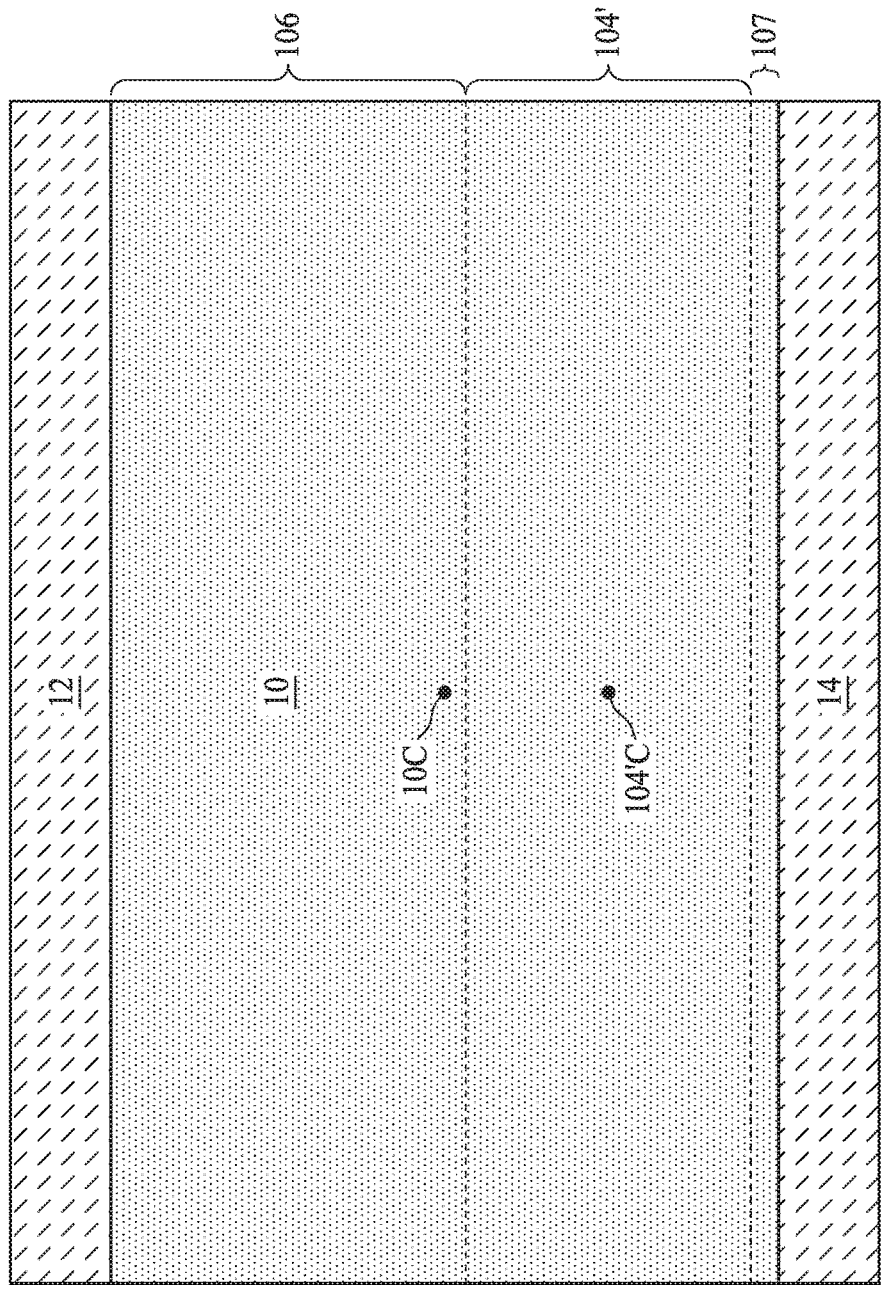
FIG. 2B illustrates a cross-sectional lateral view of a substrate according to some embodiments of the present disclosure.

FIG. 2B illustrates a cross-sectional lateral view of the substrate 2 according to some embodiments of the present disclosure.

On a lateral side of the dielectric layer 10, the central line 104'C is located at a middle point of the reinforcement structure 104'. The central line 10C is located at a middle point of the dielectric layer 10. The middle point of the central line 104'C of the reinforcement structure 104' is separated from the middle point of the central line 10C of the dielectric layer 10 by a non-zero distance. For example, the non-zero distance is at least about 5%, at least about 10%, or at least about 15% of a thickness of the dielectric layer 10.

Figure 3:
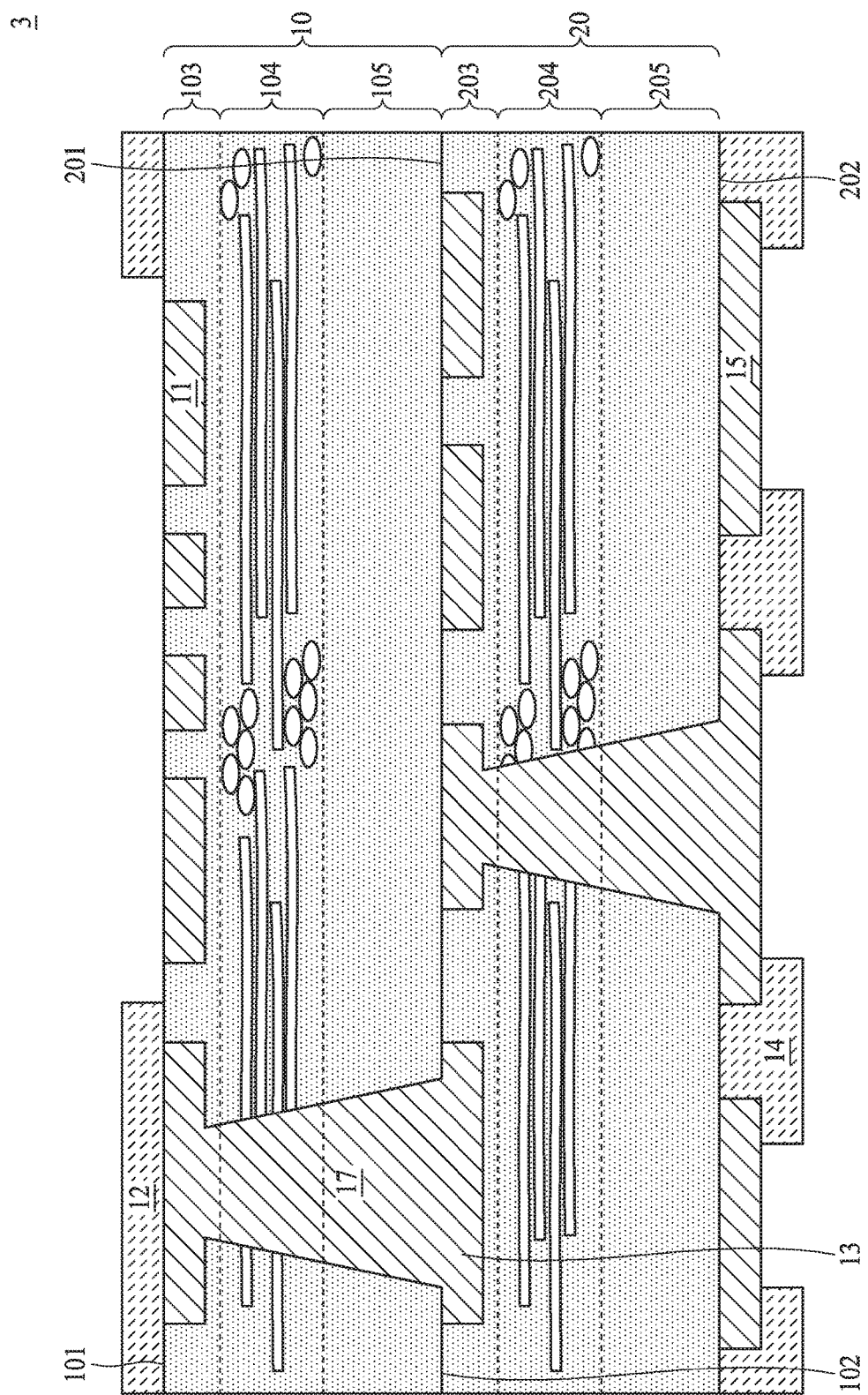
FIG. 3 illustrates a cross-sectional view of a substrate according to some embodiments of the present disclosure.

FIG. 3 illustrates a cross-sectional view of a substrate 3 for packaging a semiconductor device according to some embodiments of the present disclosure. The substrate 3 includes a dielectric layer 10, a protection layer 12, another dielectric layer 20, a protection layer 14, patterned conductive layers 11, 13, and 15, and interconnection elements 17. The patterned conductive layer 11 is electrically connected to the patterned conductive layer 13 via at least one interconnection element 17, and the patterned conductive layer 13 is electrically connected to the patterned conductive layer 15 via at least another interconnection element 17. The structure depicted in FIG. 3 is similar to the structure depicted in FIG. 1A, except that the dielectric layer 20 is additionally disposed on a surface 102 of the dielectric layer 10.

The dielectric layer 20 includes a surface 201 and a surface 202 opposite to the surface 201. The dielectric layer 20 includes a resin structure/layer and a fiberglass. In some embodiments, the dielectric layer 20 includes portions 203 and 205 and a reinforcement structure 204. The portion 203 and the portion 205 are resin layers. In some embodiments, the portion 203 and the portion 205 are each substantially devoid of glass fibers or other reinforcement fibers, such as where any such fibers constitute less than about 5 percent by weight of each of the portion 203 and the portion 205. A thickness of the portion 205 is greater than a thickness of the portion 203, such as at least about 1.1 times greater, at least about 1.2 times greater, at least about 1.3 times greater, or at least about 1.5 times greater. The reinforcement structure 204 includes a resin layer and a fiberglass. The reinforcement structure 204 is between the portion 203 and the portion 205. The reinforcement structure 204 is adjacent to the surface 201 of the dielectric layer 20. The reinforcement structure 204 is separated or spaced from the patterned conductive layer 13 by a distance. The distance between the reinforcement structure 204 and the patterned conductive layer 13 is a non-zero value.

In some embodiments, a density of the patterned conductive layer 13 is less than a density of the patterned conductive layer 15. In such embodiments, a thickness of the patterned conductive layer 13 may be substantially the same as a thickness of the patterned conductive layer 15.

In some embodiments, the thickness of the patterned conductive layer 13 is less than the thickness of the patterned conductive layer 15. In such embodiments, the density of the patterned conductive layer 13 may be substantially the same as the density of the patterned conductive layer 15.

That is, an amount of a conductive material disposed adjacent to the surface 202 of the dielectric layer 20 is greater than an amount of the conductive material disposed adjacent to the surface 201 of the dielectric layer 20, which may otherwise cause a left end and a right end of the dielectric layer 10 to upwardly bend. The positioning of the reinforcement structure 204 closer to the surface 201 of the dielectric layer 20 mitigates against the upward bending of the dielectric layer 20 so as to counterbalance against such warpage, without requiring adjusting a thickness of the protection layer 12 or 14.

FIG. 4A through FIG. 4I illustrate some embodiments of a method of manufacturing the substrate 2. It should be understood that the method may be similarly applied to manufacturing the substrate 1 or the substrate 3.

Figure 4A:
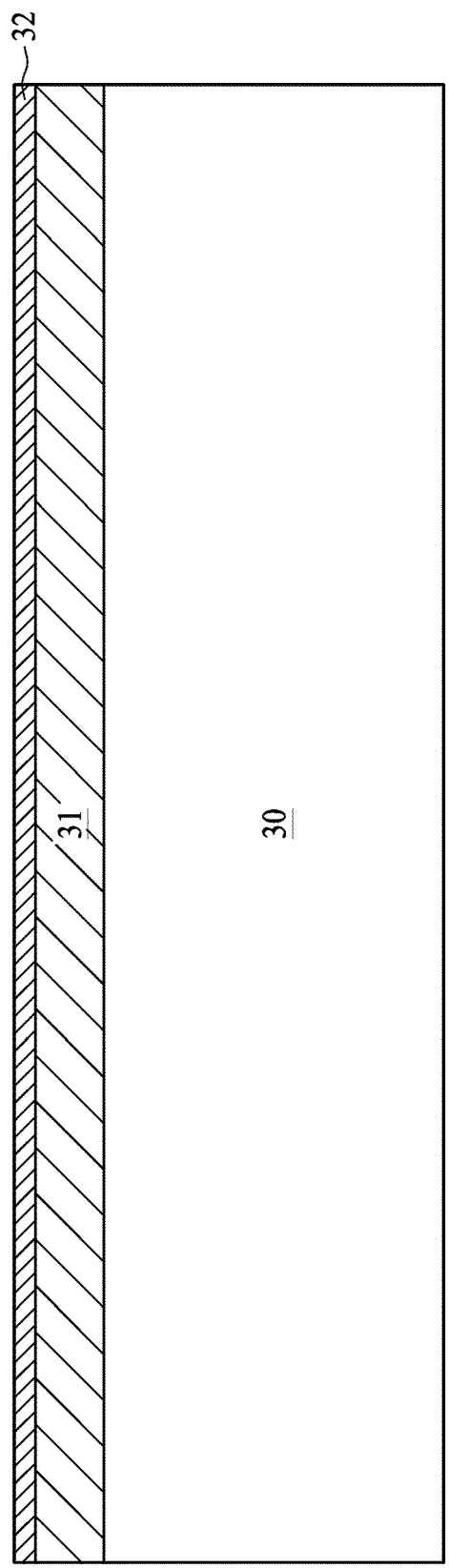
FIG. 4A illustrates a method of manufacturing a substrate according to some embodiments of the present disclosure.

Referring to FIG. 4A, the method includes providing a carrier 30 with a conductive layer 31 and a conductive layer 32. A thickness of the conductive layer 31 is in a range from about 15 μm to about 20 μm. A thickness of the conductive layer 32 is in a range from about 2 μm to about 4 μm. In some embodiments, the conductive layer 31 and conductive layer 32 may be replaced with a single conductive layer.

Figure 4B:
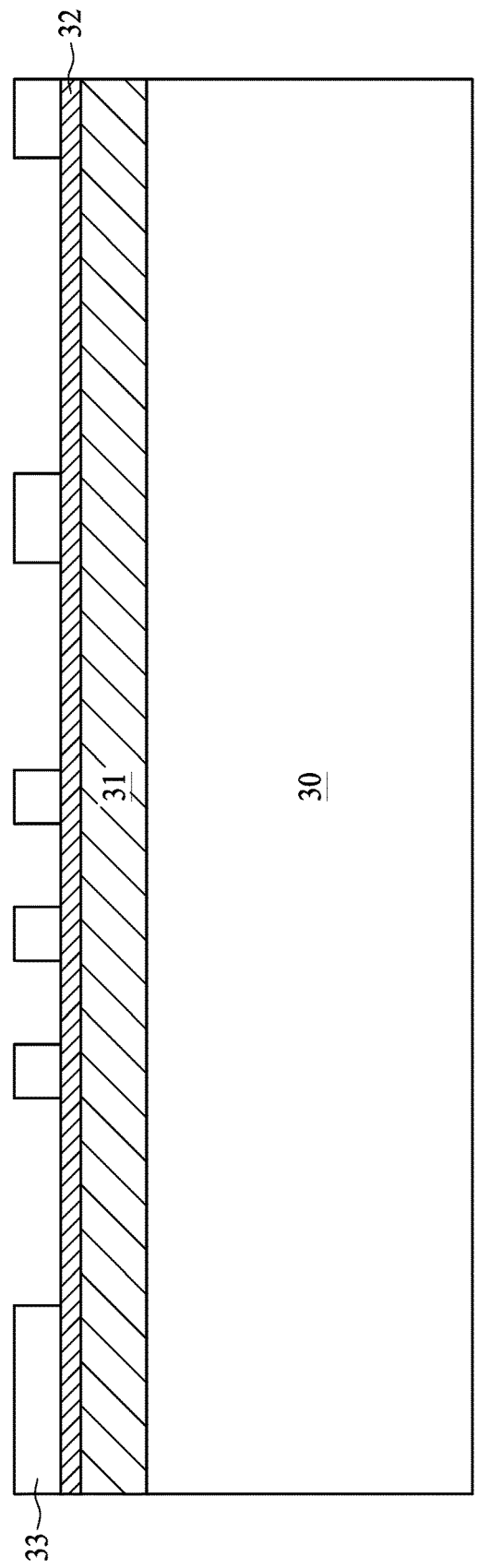
FIG. 4B illustrates a method of manufacturing a substrate according to some embodiments of the present disclosure.

Referring to FIG. 4B, a patterned photoresist layer 33 is disposed or formed on the conductive layer 32.

Figure 4C:
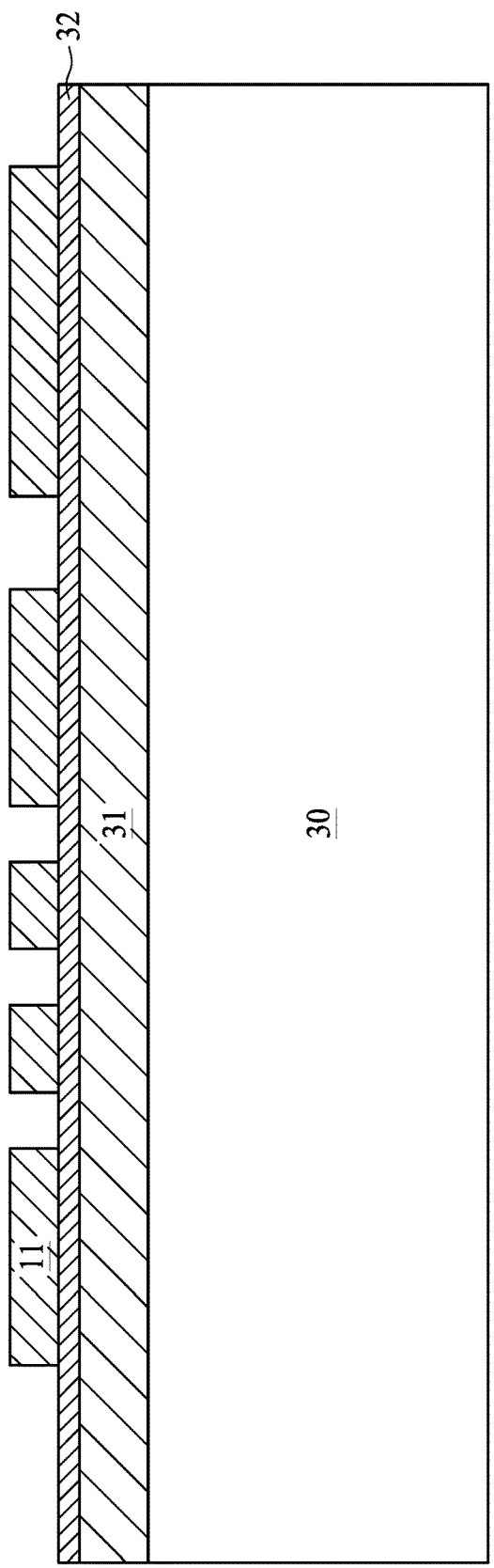
FIG. 4C illustrates a method of manufacturing a substrate according to some embodiments of the present disclosure.

Referring to FIG. 4C, a patterned conductive layer 11 is formed on the conductive layer 32, by depositing or plating a conductive material on portions of the conductive layer 32 exposed by the patterned photoresist layer 33. Then, the patterned photoresist layer 33 is removed.

Figure 4D:
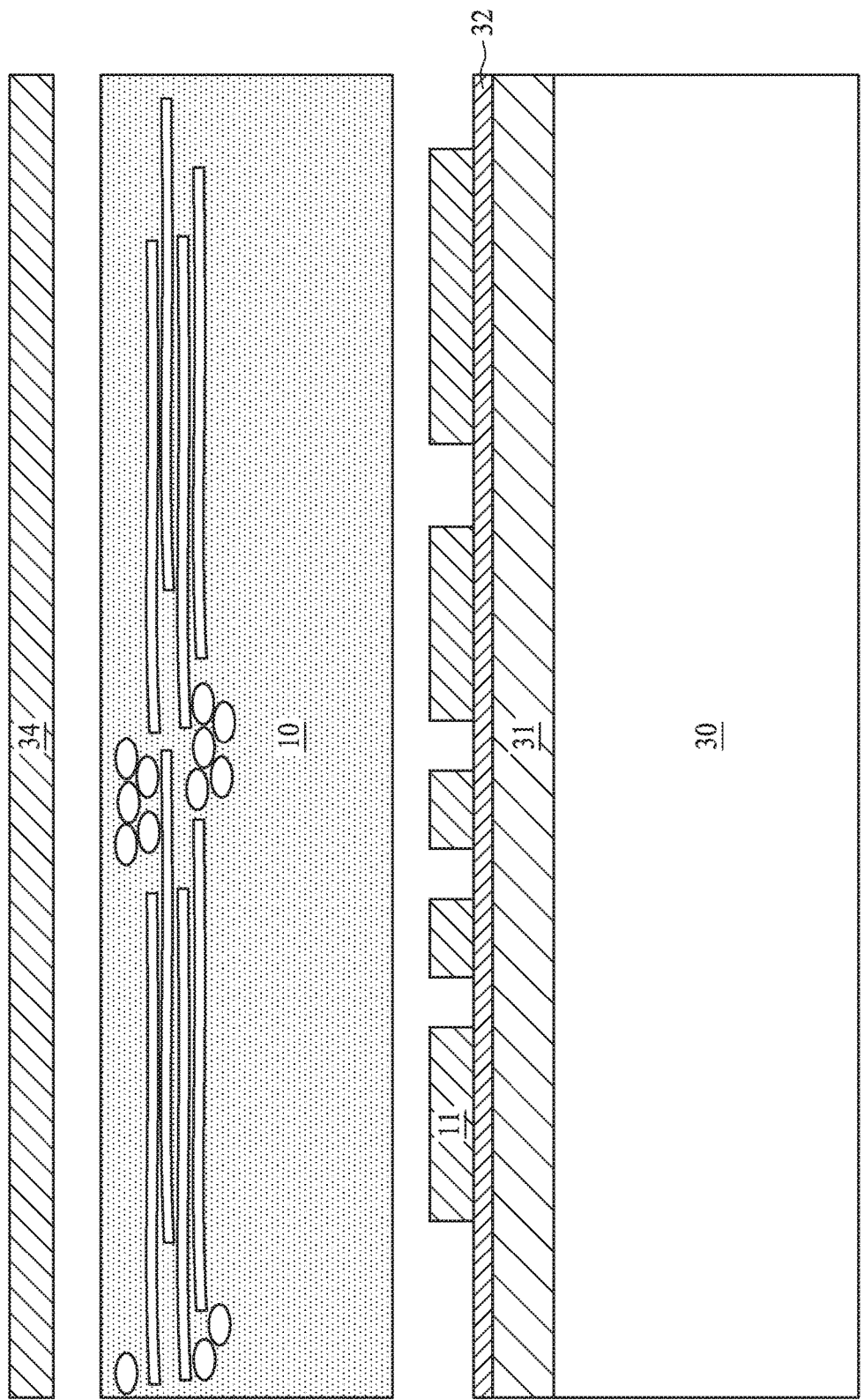
FIG. 4D illustrates a method of manufacturing a substrate according to some embodiments of the present disclosure.

Referring to FIG. 4D, a dielectric layer 10 is laminated on the patterned conductive layer 11. The dielectric layer 10 is a structure with an asymmetric fiberglass arrangement. A conductive layer 34 is disposed or formed on the dielectric layer 10.

Figure 4E:
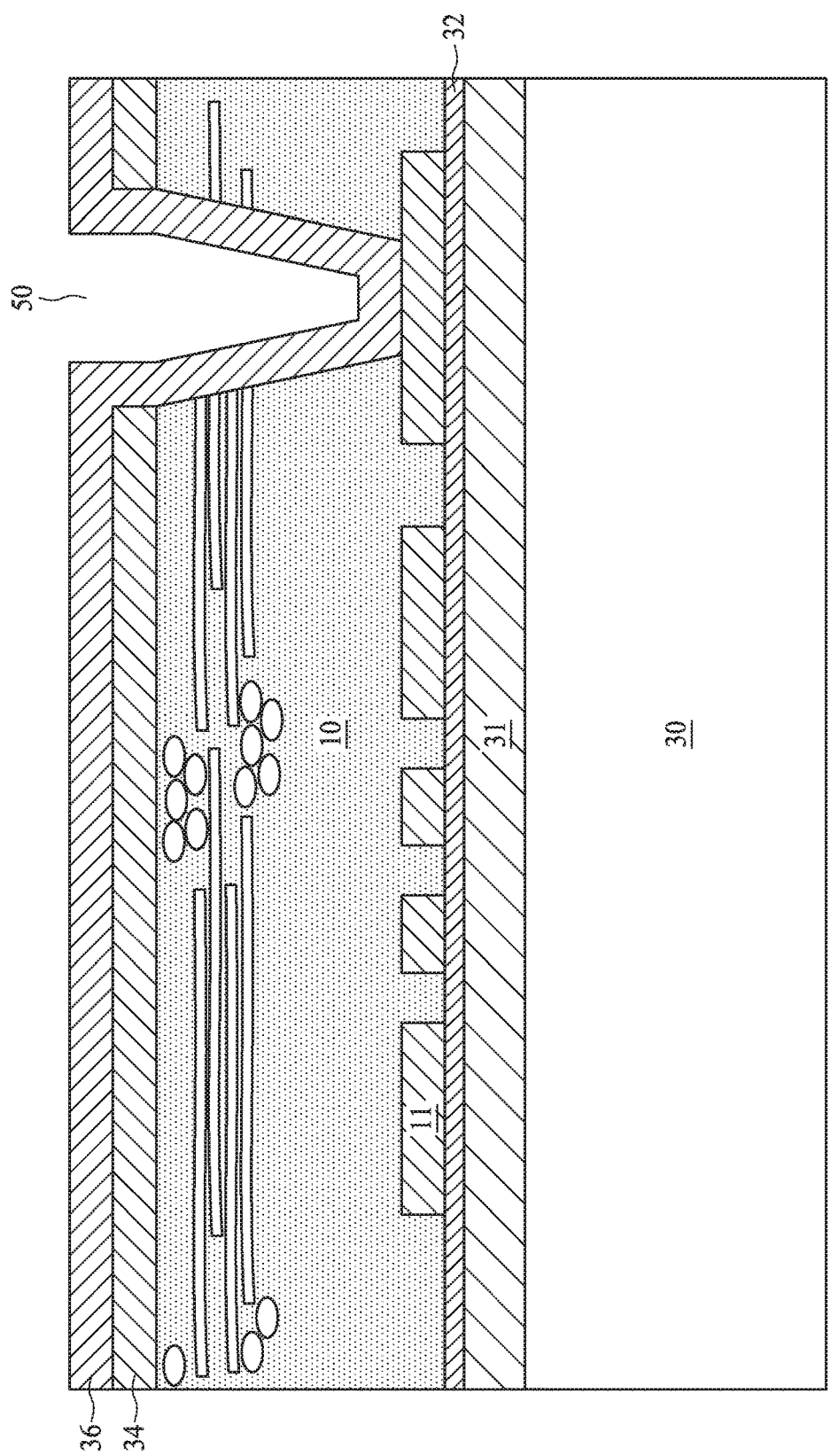
FIG. 4E illustrates a method of manufacturing a substrate according to some embodiments of the present disclosure.

Referring to FIG. 4E, an opening 50 is formed in the dielectric layer 10 to expose the patterned conductive layer 11. The opening 50 of the dielectric layer 10 may be formed by a laser drilling technique, a mechanical drilling technique, or an etching technique. A seed layer 36 is formed over the conductive layer 34 and the dielectric layer 10.

Figure 4F:
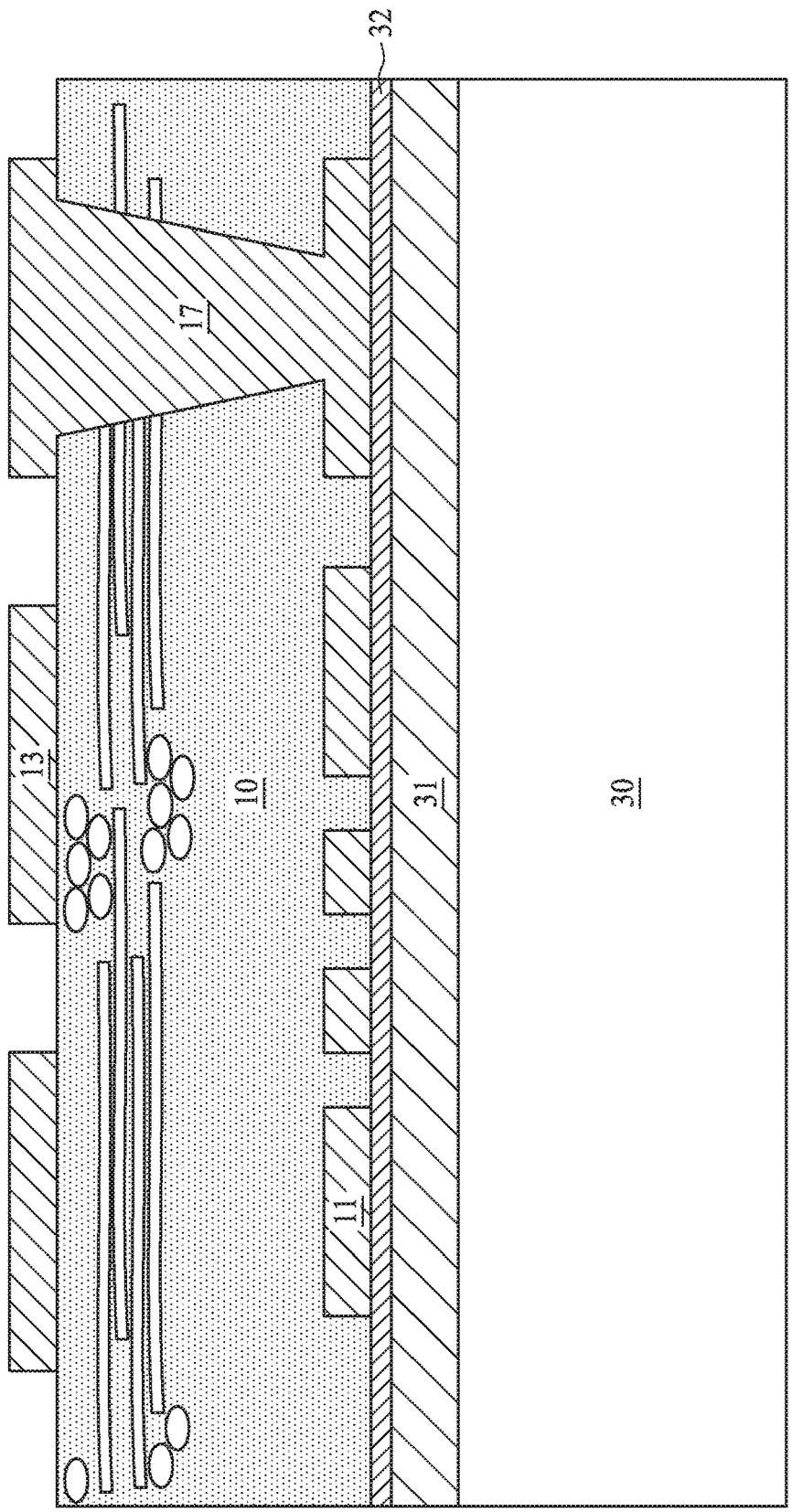
FIG. 4F illustrates a method of manufacturing a substrate according to some embodiments of the present disclosure.

Referring to FIG. 4F, a patterned conductive layer 13 is formed on the dielectric layer 10, by depositing or plating a conductive material on portions of the seed layer 36 and the conductive layer 34, and removing remaining portions of the seed layer 36 and the conductive layer 34. An interconnection element 17 is formed to electrically connect the patterned conductive layer 11 to the patterned conductive layer 13.

Figure 4G:
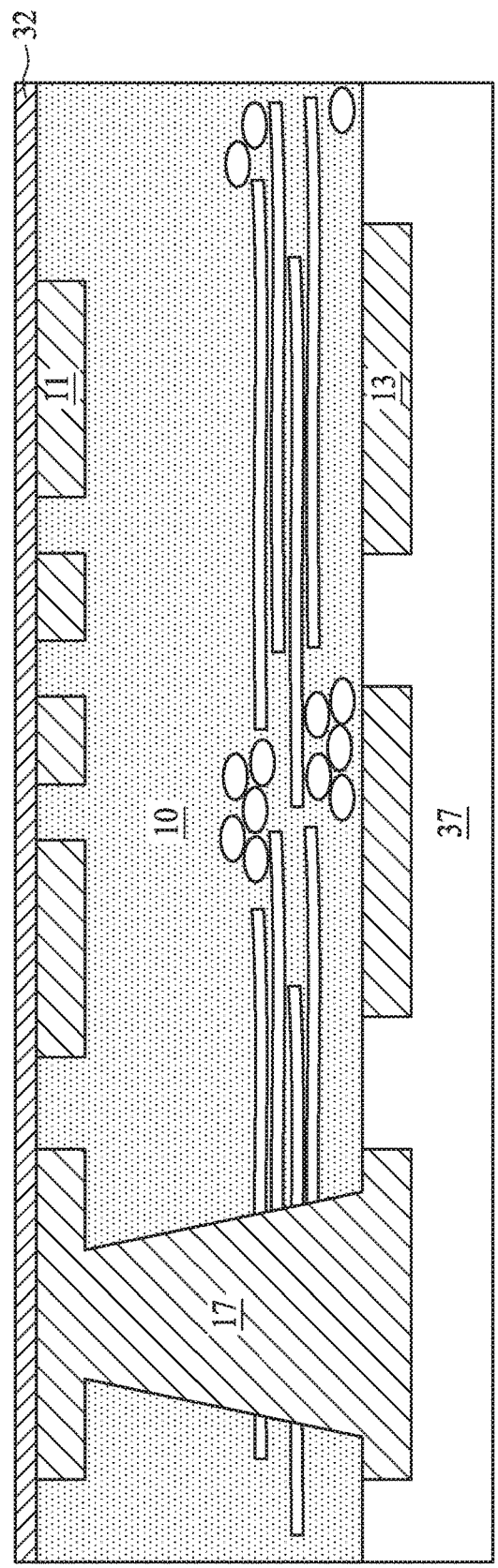
FIG. 4G illustrates a method of manufacturing a substrate according to some embodiments of the present disclosure.

Referring to FIG. 4G, a dielectric layer 37 is laminated on the dielectric layer 10 to substantially completely cover the patterned conductive layer 13. The dielectric layer 37 may be a photoresist dry film. The carrier 30 and the conductive layer 31 are removed.

Figure 4H:
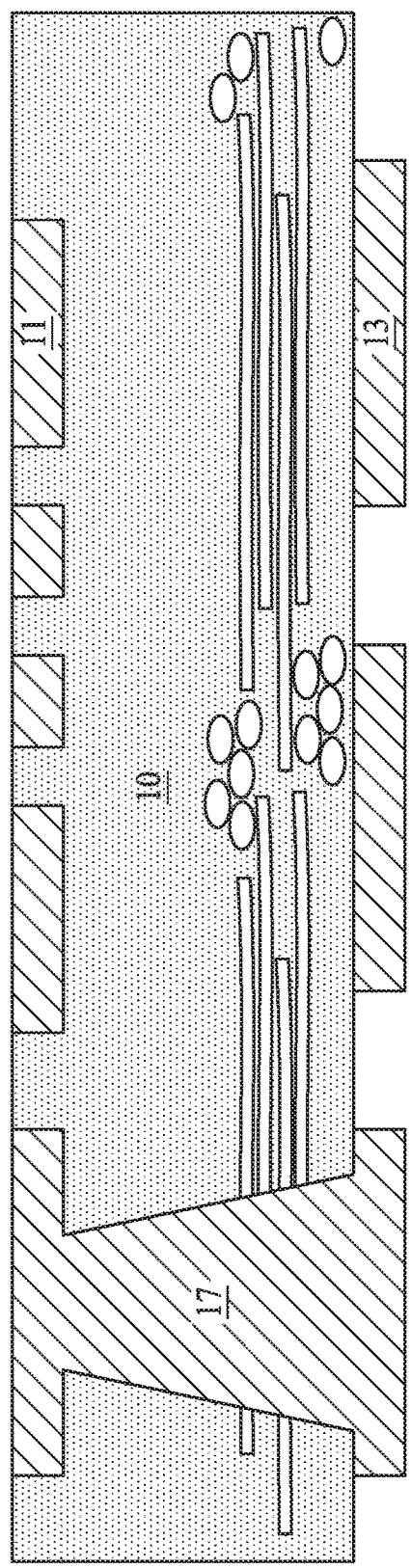
FIG. 4H illustrates a method of manufacturing a substrate according to some embodiments of the present disclosure.

Referring to FIG. 4H, the conductive layer 32 is etched or otherwise removed to expose the patterned conductive layer 11. The dielectric layer 37 is stripped to expose the patterned conductive layer 13.

Figure 4I:
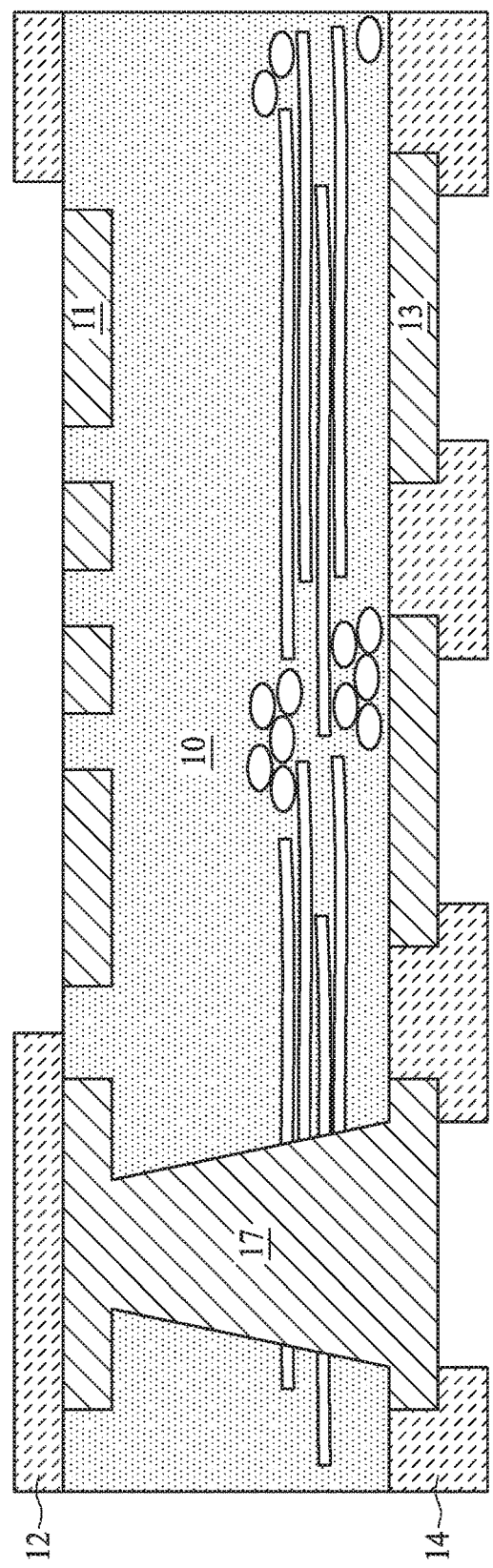
FIG. 4I illustrates a method of manufacturing a substrate according to some embodiments of the present disclosure.

Referring to FIG. 4I, a protection layer 12 is disposed or formed on the dielectric layer 10 to partially cover the patterned conductive layer 11. A protection layer 14 is disposed or formed on the dielectric layer 10 to partially cover the patterned conductive layer 13. The protection layers 12 and 14 may each be a solder mask layer.

Additional operations can be performed subsequent to the stage illustrated in FIG. 4I to form the substrate 3 illustrated in FIG. 3. For example, a dielectric layer 20 is laminated on the patterned conductive layer 13. The dielectric layer 20 is a structure with an asymmetric fiberglass arrangement. Next, a patterned conductive layer 15 is disposed or formed on a surface 202 of the dielectric layer 20.

In additional embodiments, a semiconductor device package includes the substrate 1, 2, or 3, a semiconductor device (e.g., a chip or a die) disposed on a top side of the substrate 1, 2, or 3 and electrically connected to the substrate 1, 2, or 3, and connectors (e.g., solder bumps) disposed on a bottom side of the substrate 1, 2, or 3 and electrically connected to the substrate 1, 2, or 3.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A substrate for packaging a semiconductor device, comprising:
  a first dielectric layer having a first surface and a second surface opposite to the first surface, the first dielectric layer comprising a first portion adjacent to the first surface, a second portion adjacent to the second surface, and a reinforcement structure between the first portion and the second portion;
  a first patterned conductive layer adjacent to the first surface of the first dielectric layer; and
  a second patterned conductive layer adjacent to the second surface of the first dielectric layer,
  wherein a thickness of the first portion of the first dielectric layer is different from a thickness of the second portion of the first dielectric layer,
  a density of the first patterned conductive layer is greater than a density of the second patterned conductive layer,
  the thickness of the first portion of the first dielectric layer is greater than the thickness of the second portion of the first dielectric layer, and
  a thickness of the first patterned conductive layer is substantially the same as a thickness of the second patterned conductive layer.

2. The substrate of claim 1, wherein a distance between the reinforcement structure and a closest one of the first patterned conductive layer and the second patterned conductive layer is a non-zero value.

3. The substrate of claim 1, further comprising:
  a second dielectric layer adjacent to the second patterned conductive layer, the second dielectric layer having a first surface and a second surface opposite to the first surface of the second dielectric layer, the second dielectric layer comprising a first portion adjacent to the first surface of the second dielectric layer, a second portion adjacent to the second surface of the second dielectric layer, and a reinforcement structure between the first portion of the second dielectric layer and the second portion of the second dielectric layer; and
  a third patterned conductive layer adjacent to the second surface of the second dielectric layer, wherein a thickness of the first portion of the second dielectric layer is different from a thickness of the second portion of the second dielectric layer.

4. The substrate of claim 3, wherein the reinforcement structure of the first dielectric layer is closer to the first patterned conductive layer than the second patterned conductive layer or the reinforcement structure of the first dielectric layer is closer to the second patterned conductive layer than the first patterned conductive layer, and the reinforcement structure of the second dielectric layer is closer to the second patterned conductive layer than the third patterned conductive layer or the reinforcement structure of the second dielectric layer is closer to the third patterned conductive layer than the second patterned conductive layer.

5. The substrate of claim 1, wherein the reinforcement structure comprises a fiberglass.

6. The substrate of claim 1, wherein the first patterned conductive layer is embedded in the first dielectric layer.

7. The substrate of claim 1, further comprising a first protection layer disposed on the first surface of the first dielectric layer and at least partially covering the first patterned conductive layer.

8. The substrate of claim 1, further comprising a second protection layer disposed on the second surface of the first dielectric layer and at least partially covering the second patterned conductive layer.

9. A substrate for packaging a semiconductor device, comprising:
    a dielectric layer having a first surface and a second surface opposite to the first surface, the dielectric layer comprising a resin layer and a reinforcement structure, and further comprising a first portion and a second portion;
    a first patterned conductive layer adjacent to the first surface of the dielectric layer; and
    a second patterned conductive layer adjacent to the second surface of the dielectric layer,
    wherein a central line of the reinforcement structure of the dielectric layer is offset from a central line of the dielectric layer,
    a density of the first patterned conductive layer is greater than a density of the second patterned conductive layer,
    a thickness of the first portion of the dielectric layer is greater than a thickness of the second portion of the dielectric layer, and
    a thickness of the first patterned conductive layer is substantially the same as a thickness of the second patterned conductive layer.

10. The substrate of claim 9, wherein the central line of the reinforcement structure is separated from the central line of the dielectric layer by a non-zero distance.

11. The substrate of claim 9, wherein the first patterned conductive layer is embedded in the dielectric layer.

12. The substrate of claim 9, wherein the reinforcement structure comprises a fiberglass, and a coefficient of thermal expansion (CTE) of the reinforcement structure is less than a CTE of the resin layer.

13. The substrate of claim 9, wherein the dielectric layer is a first dielectric layer, the substrate further comprising:
    a second dielectric layer adjacent to the second patterned conductive layer, the second dielectric layer having a first surface and a second surface opposite to the first surface of the second dielectric layer, the second dielectric layer comprising a resin layer and a reinforcement structure; and
    a third patterned conductive layer adjacent to the second surface of the second dielectric layer,
    wherein a central line of the reinforcement structure of the second dielectric layer is offset from a central line of the second dielectric layer.

14. The substrate of claim 13, wherein the reinforcement structure of the first dielectric layer is closer to the first patterned conductive layer than the second patterned conductive layer or the reinforcement structure of the first dielectric layer is closer to the second patterned conductive layer than the first patterned conductive layer, and the reinforcement structure of the second dielectric layer is closer to the second patterned conductive layer than the third patterned conductive layer or the reinforcement structure of the second dielectric layer is closer to the third patterned conductive layer than the second patterned conductive layer.

* * * * *